United States Patent
Shin et al.

(10) Patent No.: US 7,285,917 B2
(45) Date of Patent: Oct. 23, 2007

(54) CONNECTION MEMBER AND DRIVING DEVICE OF PLASMA DISPLAY PANEL

(75) Inventors: Sung Gon Shin, Kyoungsangnam-do (KR); Jin Young Kim, Daegu (KR)

(73) Assignee: LG Electronics Inc., Seoul (KR)

( * ) Notice: Subject to any disclaimer, the term of this patent is extended or adjusted under 35 U.S.C. 154(b) by 34 days.

(21) Appl. No.: 10/890,091

(22) Filed: Jul. 14, 2004

(65) Prior Publication Data

US 2005/0012729 A1    Jan. 20, 2005

(30) Foreign Application Priority Data

Jul. 15, 2003    (KR) ...................... 10-2003-0048251

(51) Int. Cl.
- *G09G 3/10* (2006.01)
- *H01J 9/00* (2006.01)
- *H01J 9/24* (2006.01)
- *H01J 1/46* (2006.01)
- *H01J 21/10* (2006.01)

(52) U.S. Cl. ............... 315/169.1; 315/169.4; 445/24; 445/67; 313/306

(58) Field of Classification Search ............... 315/167, 315/169.1, 169.4; 445/24, 46, 66, 67; 313/306, 313/307; 345/60; 439/908
See application file for complete search history.

(56) References Cited

U.S. PATENT DOCUMENTS

| | | | | |
|---|---|---|---|---|
| 3,742,296 | A * | 6/1973 | Krembs .................... | 315/169.4 |
| 4,121,135 | A * | 10/1978 | Hunt et al. .................... | 439/66 |
| 4,586,789 | A * | 5/1986 | Kishimoto et al. ......... | 349/152 |
| 4,613,855 | A * | 9/1986 | Person et al. .................. | 345/60 |
| 4,985,663 | A * | 1/1991 | Nakatani .................. | 315/169.3 |
| 5,825,439 | A * | 10/1998 | Noriyama .................... | 349/54 |
| 6,124,677 | A * | 9/2000 | Lardeau et al. .......... | 315/169.4 |
| 6,339,247 | B1 * | 1/2002 | Taguchi ...................... | 257/433 |
| 6,563,272 | B1 | 5/2003 | Dufort ..................... | 315/169.3 |
| 6,597,113 | B1 * | 7/2003 | Nitta ........................... | 313/581 |
| 6,628,364 | B2 * | 9/2003 | Yeo et al. .................... | 349/151 |
| 6,703,792 | B2 * | 3/2004 | Kawada et al. .......... | 315/169.4 |
| 6,710,547 | B2 * | 3/2004 | Kim ........................ | 315/169.1 |
| 2002/0044242 | A1 * | 4/2002 | Kim ........................... | 349/139 |
| 2003/0020675 | A1 * | 1/2003 | Sekii ........................... | 345/60 |

(Continued)

FOREIGN PATENT DOCUMENTS

JP    10 255925 A    9/1998

(Continued)

*Primary Examiner*—Don Wong
*Assistant Examiner*—Marie Antoinette Cabucos
(74) *Attorney, Agent, or Firm*—Ked & Associates, LLP (57) ABSTRACT

A connection member for a flat-panel display is coupled to an electrode terminal part on one side of the panel and an integrated driving circuit on an opposing side of the panel. The connection member provides driving signals to at least one scan electrode and at least one common electrode coupled to the electrode terminal part. The connection member further includes joining parts, each of which has a two-tier structure of scan and common electrode pads. Moreover, the connection member is provided for the scan and common electrodes in the panel on only one side of the panel, thereby saving space and reducing power requirements through use of the integrated driving circuit which provides driving signals for both the scan and common electrodes.

22 Claims, 5 Drawing Sheets

U.S. PATENT DOCUMENTS

2004/0233132 A1* 11/2004 Choi et al. .................... 345/60

FOREIGN PATENT DOCUMENTS

| JP | 11 344936 A | 12/1999 |
| JP | 2000 173481 A | 6/2000 |
| JP | 2000 347592 A | 12/2000 |
| JP | 2003 178686 A | 6/2003 |

* cited by examiner

CONNECTION MEMBER AND DRIVING DEVICE OF PLASMA DISPLAY PANEL

This application claims the benefit of the Korean Patent Application No. P2003-48251 filed on Jul. 15, 2003, which is hereby incorporated by reference.

BACKGROUND OF THE INVENTION

1. Field of the Invention

The present invention relates to a plasma display panel, and more particularly to a connection member that connects an integrated board with an electrode and a driving device of a plasma display panel.

2. Description of the Related Art

Recently, Flat Panel Displays have briskly been developed, which include Liquid Crystal Displays (hereinafter 'LCD'), Field Emission Displays (hereinafter 'FED'), Plasma Display Panels (hereinafter 'PDP'). The PDP among them has advantages of easy production due to its simple structure, excellence of high brightness and high light-emission efficiency, memory function, and wide viewing angle of over 160°, in addition, being realized into a large screen of over 40 inches.

Figure 1:
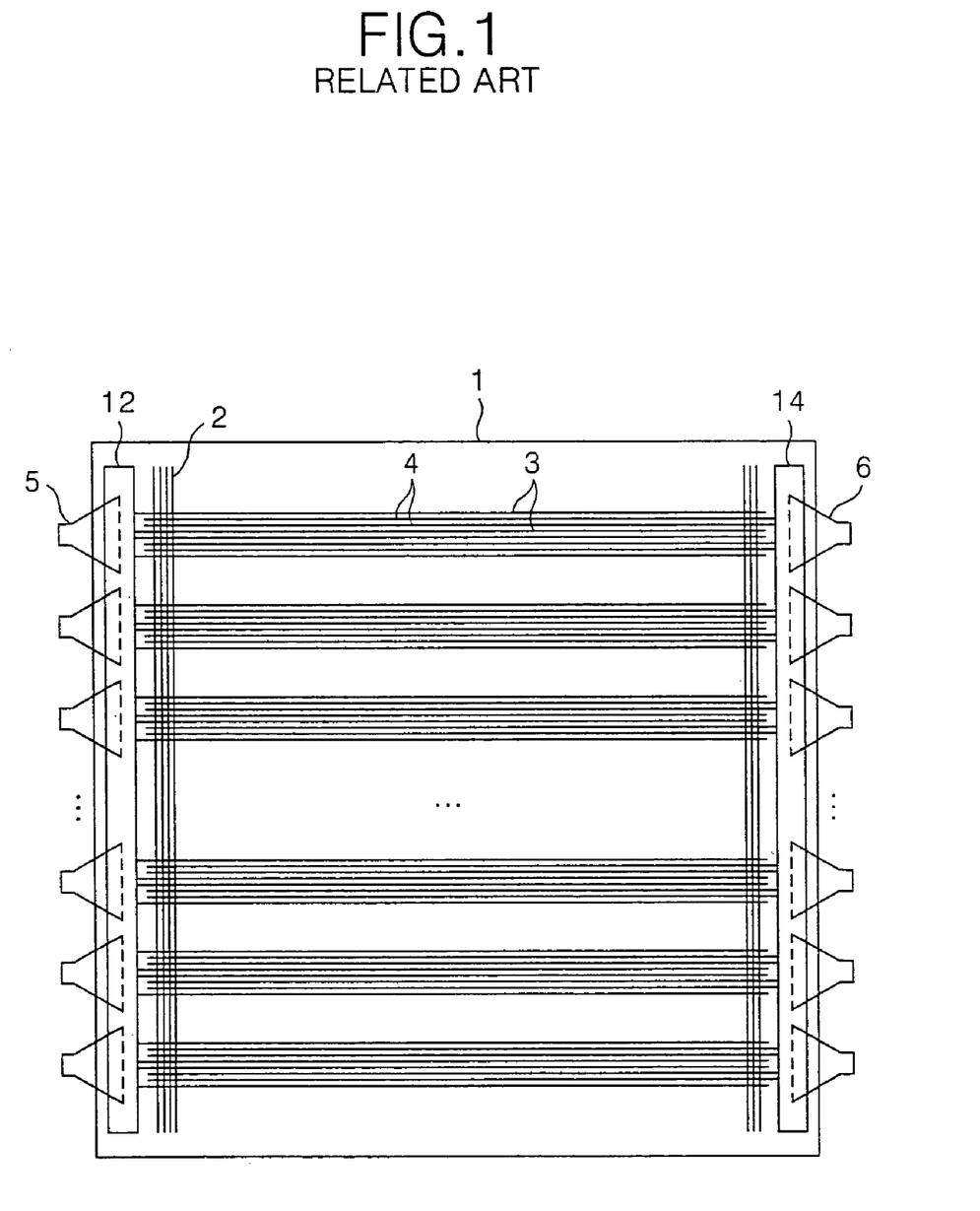
FIG. 1 is a diagram representing a front substrate of prior art where all electrodes are arranged.
Figure 2:
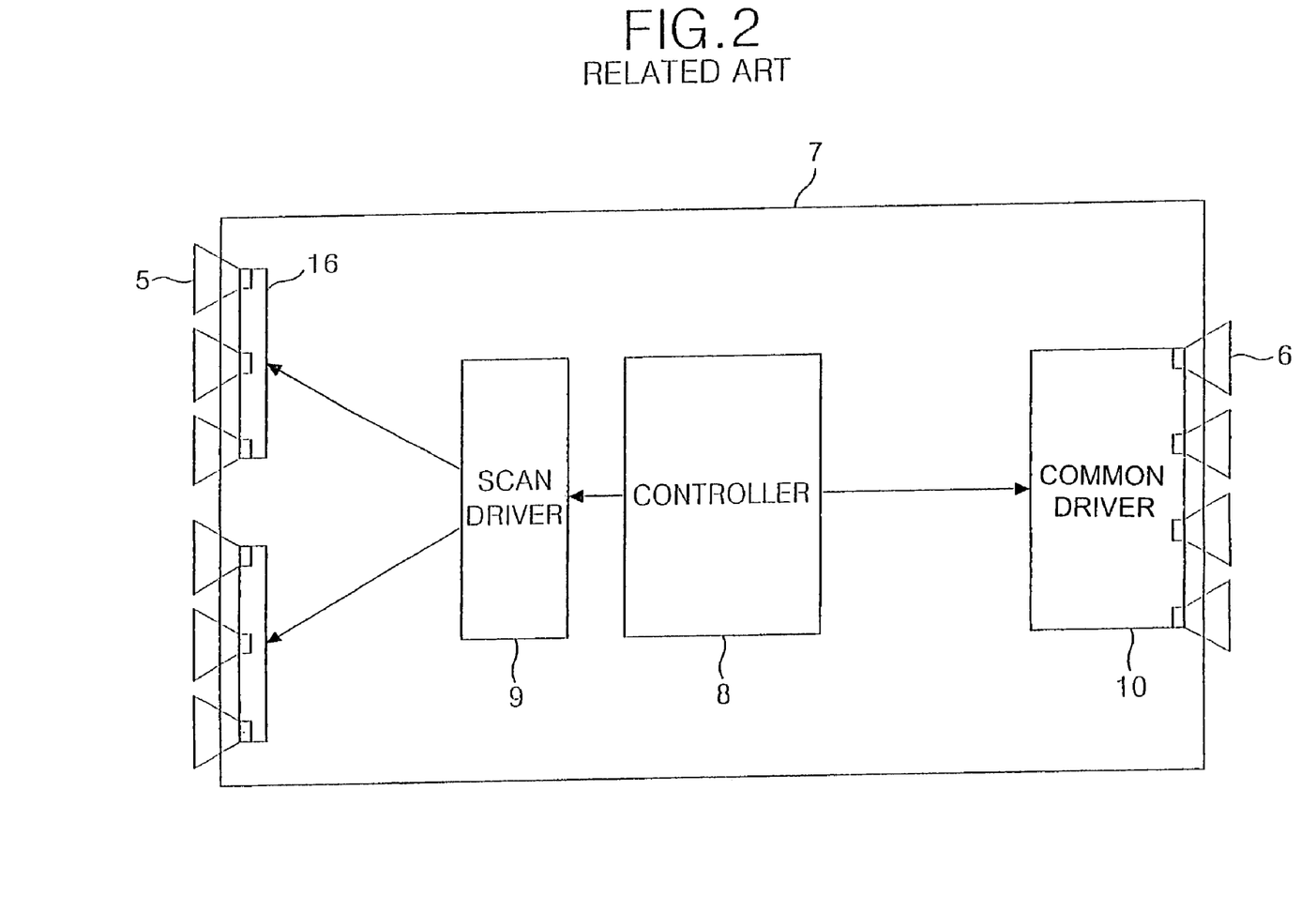
FIG. 2 is a diagram representing a rear substrate of prior art that includes a driving device.

FIG. 1 is a diagram representing a front substrate where electrodes are arranged according to prior art. FIG. 2 is a diagram representing a rear substrate with a driving device according to prior art.

Referring to FIGS. 1 and 2, in the front substrate 1, an address electrode 2 is arranged and a scan electrode 3 and a common electrode 4 are arranged to cross the address electrode 2. A dielectric layer, a protective layer, barrier ribs and a phosphorus layer etc are formed in the front substrate by use of a plasma process technique though they are not shown in FIG. 1.

Also, a scan electrode terminal part 12 and a common electrode terminal part 14 leading to the scan electrode 3 and the common electrode 4 are provided at both sides in the front substrate 1.

A driving device for applying a driving signal to each of electrodes 2, 3, 4 which are arranged in this way, is provided in the rear substrate 7 which is adhered to the front substrate 1 opposite thereto.

As shown in FIG. 2, the rear substrate 7 includes a controller 8 to control the driving signal, a scan driver 9 and a common driver 10 to generate a designated driving signal in accordance with the control signal of the controller 8. At this moment, the scan driver 9 is provided at one side of the rear substrate 7, and the common driver 10 is provided at the other side of the rear substrate 7. Also, though not shown in FIG. 2, the rear substrate 7 further includes an address driver to generate a driving signal for driving the address electrode 2 of FIG. 1.

Also, the rear substrate 7 includes connection members 5, 6 connecting each of electrode terminal parts 12, 14 with each of drivers 9, 10 in order to apply the driving signal generated at the scan driver 9 and the common driver 10 to the scan electrode 3 and the common electrode 4 of FIG. 1.

At this moment, the rear substrate 7 further includes a buffer 16 for applying the scan signal generated from the scan driver 9 to a corresponding scan electrode. In this case, the connection member 5 is connected between the buffer 16 and the scan electrode terminal part of the front substrate 1.

The connection members 5 and 6 are provided at one side of the rear substrate 7 in case of being connected to the buffer 16, and at the other side of the rear substrate 7 in case of being connected to the common driver 10. Accordingly, the connection member 5 connected to the buffer 16 is connected to the scan electrode terminal part 12 and the connection member 6 connected to the common driver 10 is connected to the common electrode terminal part 14.

In the operation when composed as above, the control signal for driving each electrode is inputted to the scan driver 9 or the common driver 10 by the controller 8.

The scan driver 9 generates the scan signal in accordance with the control signal and transmits it to the buffer 16. The buffer 16 finds the corresponding scan electrode on the basis of the scan signal and inputs the scan signal to the corresponding scan electrode through the connection member 5 and the scan electrode terminal part 12, thereby driving the corresponding scan electrode.

On the other hand, the common driver 10 generates the common signal in accordance with the control signal of the controller 8 and applies the common signal to the common electrode 4 through the common electrode terminal part 14, thereby driving the common electrode 4.

The driving device of prior art as above has the drivers 9 and 10, which drives the scan electrode 3 and the common electrode 4, separated from each other. And the connection members 5 and 6 connected to the drivers 9 and 10 are also separated from others. Thus the area occupied by the components in the rear substrate is as broad as that, thereby resulting in the increase of the size.

In this way, using a plurality of the drivers 9 and 10 and the connection members 5 and 6 is to go against the trend of the plasma display panel being made thin, one of its major advantages. Therefore, it is strongly required to reduce such components to a minimum.

Also, because the plurality of drivers 9 and 10 and the connection members 5 and 6 are used as in prior art, there is a disadvantage of high cost.

Further, in case that the drivers 9 and 10 and the connection members 5 and 6 are separated from each other, its driving characteristic becomes bad when being controlled by the controller 8.

SUMMARY OF THE INVENTION

Accordingly, it is an object of the present invention to provide a connection member that is adaptive for reducing cost as well as give room to a rear substrate by being integrated with drivers, and a driving device of a plasma display panel.

In order to achieve these and other objects of the invention, a connection member connected to a electrode terminal part and an integrated driving circuit, wherein each joining part of both sides of the connection member has a two tier connection structure of a scan electrode pad and a common electrode pad according to an aspect of the present invention.

In the connection member, any one of the scan electrode pad and the common electrode pad is drawn out longer than the other.

In the connection member, the rest part except for a designate part of the end of the scan electrode pad and the common electrode pad is coated with an insulating material.

In the connection member, the width of one joining part connected to the electrode terminal part is at least wider than that of the other joining part connected to the integrated driving circuit.

A driving device of a plasma display panel according to an aspect of the present invention, includes an integrated driving circuit installed at one side of a rear substrate to integrally driving a scan electrode and a common electrode which are arranged on a front substrate; an electrode terminal part provided at a location opposite to the integrated driving circuit on the front substrate to lead to the scan electrode and the common electrode; and a connection member, wherein each of both joining parts has a two tier connection structure of a scan electrode pad and a common electrode pad, one joining part is connected to the integrated driving circuit, and the other joining part is connected to the electrode terminal part.

In the driving device, any one of the scan electrode pad and the common electrode pad is drawn out longer than the other.

In the driving device, the rest part except for a designate part of the end of the scan electrode pad and the common electrode pad is coated with an insulating material.

In the driving device, the width of one joining part connected to the electrode terminal part is at least wider than that of the other joining part connected to the integrated driving circuit.

In the driving device, a connector of the integrated circuit is formed to correspond to the connection structure of the connection member.

In the driving device, the joining part of the connection member side of the electrode terminal part is formed to correspond to the connection structure of the connection member.

In the driving device, the connection member has a first layer where scan electrode pads are arranged and a second layer where common electrode pads are arranged.

In the driving device, the scan electrode pad and the common electrode pad are arranged on the same surface in both of the joining parts of the connection member.

In the driving device, the scan electrode pad and the common electrode pad are each arranged on the first layer and the second layer in both of the joining parts of the connection member.

In the driving device, the integrated driving circuit includes a driver to generate a scan signal for driving the scan electrode and a common signal for driving the common electrode; and means for applying the scan signal to a corresponding scan electrode to drive.

In the driving device, the applying means includes the connector.

In the driving device, the common signal is inputted directly to the connection member without going through the applying means.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Figure 3:
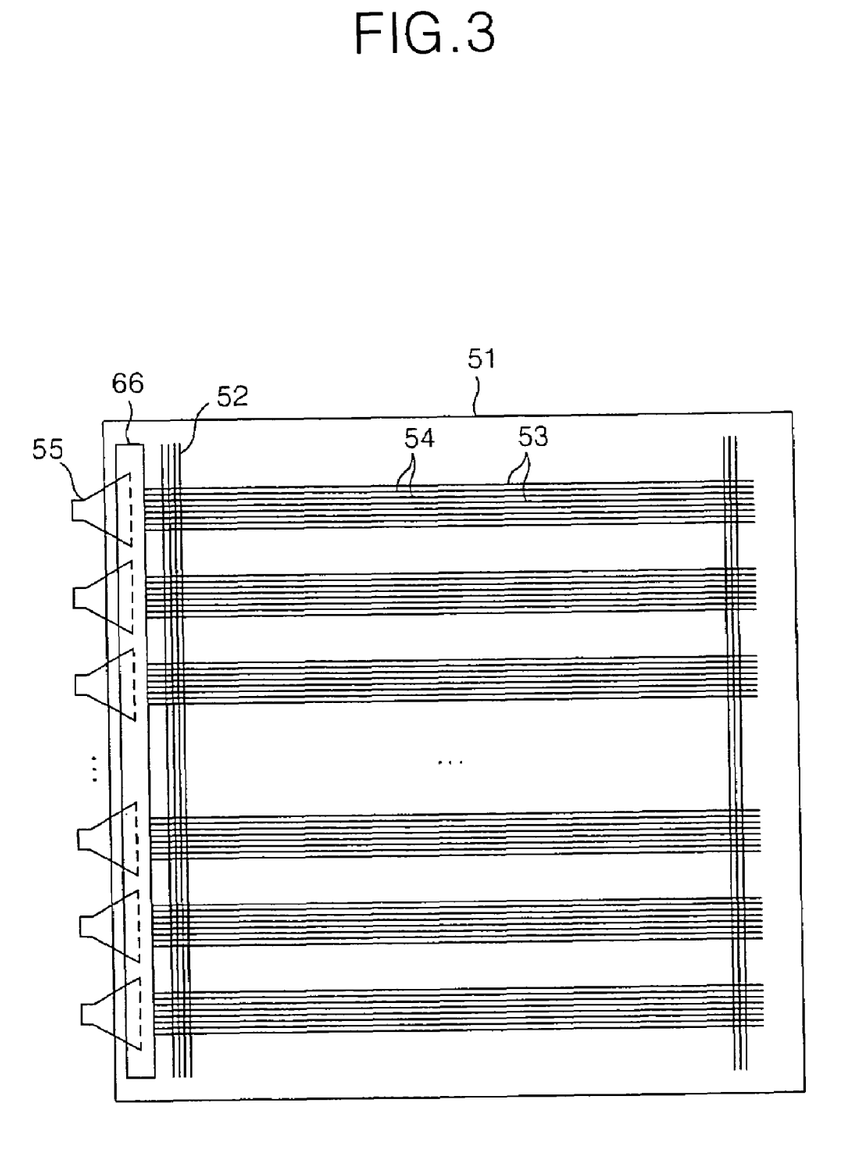
FIG. 3 is a diagram representing a front substrate where all electrodes are arranged according to a desirable embodiment of the present invention.
Figure 4:
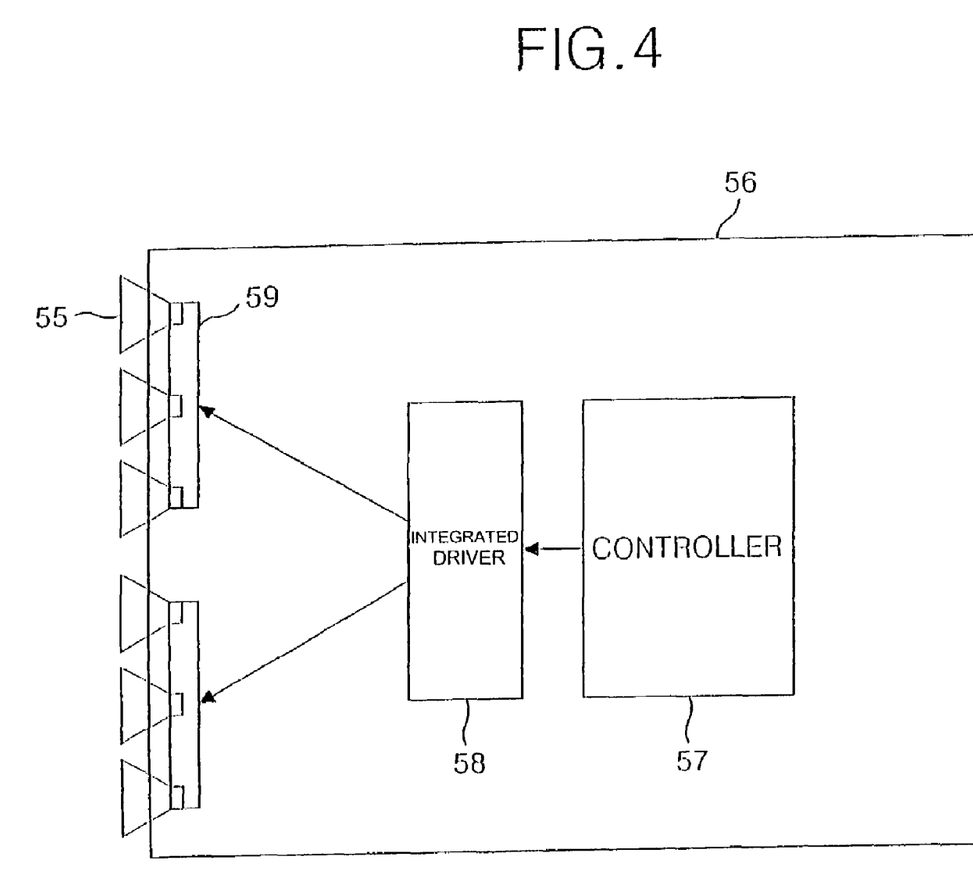
FIG. 4 is a diagram representing a rear substrate having a driving device according to a desirable embodiment of the present invention.
Figure 5:
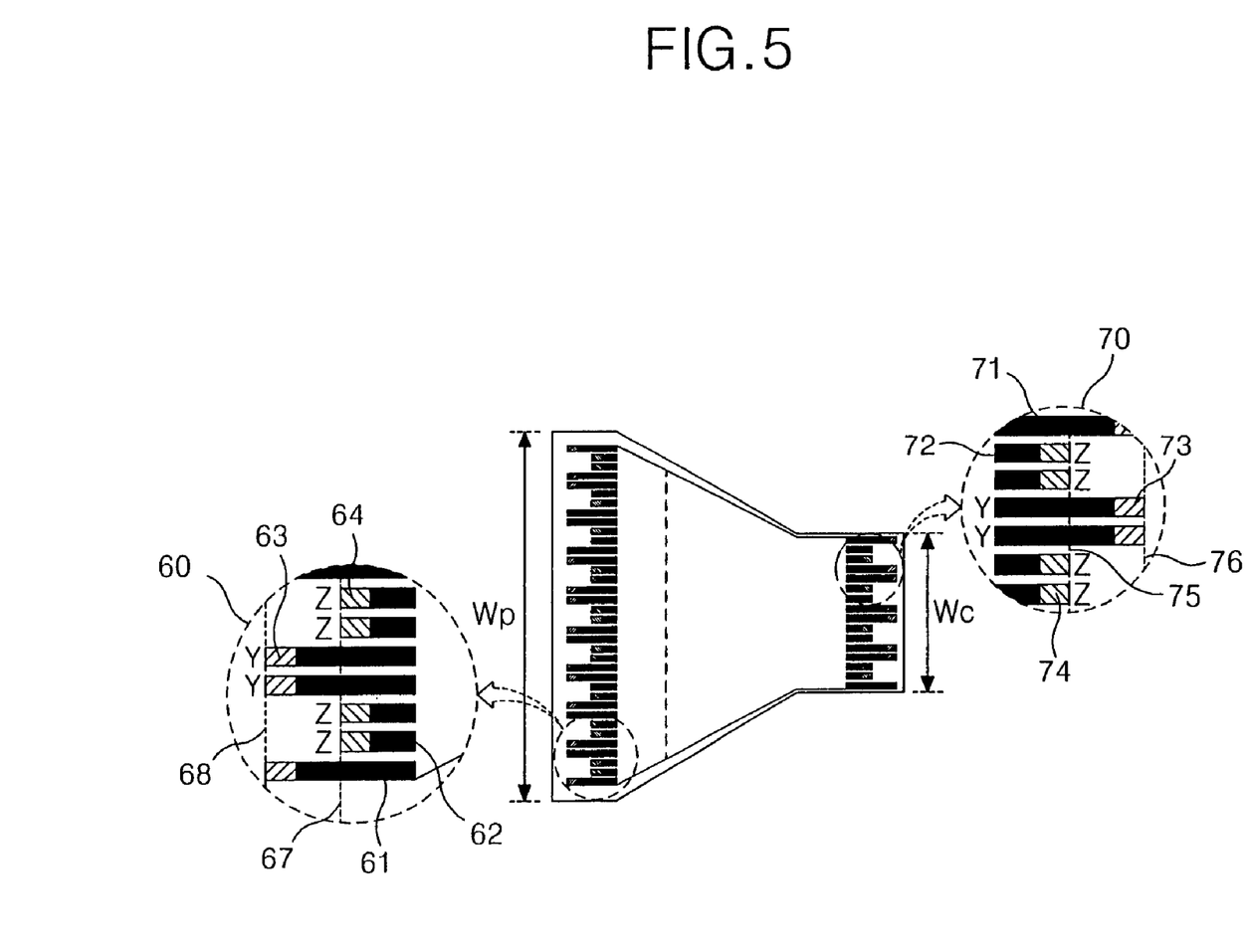
FIG. 5 is a diagram representing a connection member according to a desirable embodiment of the present invention.

With reference to FIGS. 3 to 5, embodiments of the present invention will be explained as follows.

FIG. 3 is a diagram representing a front substrate where all electrodes are arranged according to a desirable embodiment of the present invention. FIG. 4 is a diagram representing a rear substrate having a driving device according to a desirable embodiment of the present invention.

Referring to FIGS. 3 and 4, address electrodes 52 are arranged in a front substrate 51 and scan electrodes 53 and the common electrodes 54 are arranged to cross the address electrodes 52 in the front substrate 51. Of course, a dielectric layer, a protective layer, barrier ribs and a phosphorus layer are formed in the front substrate 51 though they are not shown in FIG. 3.

Further, an electrode terminal part 66 leading to each of the scan electrode 53 and the common electrode 54 is provided at one side in the front substrate 51. In the prior art, as shown in FIG. 1, whereas the electrode terminal part is separated from the scan electrode terminal part 12 and the common electrode terminal part 14 and provided at each of both sides of the front substrate 1, only one of the electrode terminal parts 66 is provided at one side of the front substrate 51 in the present invention.

A driving device for applying a driving signal to each of electrodes 52, 53, 54 which are arranged in this way, is provided in the rear substrate 56 which is adhered to the front substrate 51 opposite thereto.

As shown in FIG. 4, the rear substrate 56 includes a controller 57 to control the driving signal, and an integrated driver 58 to generate a scan signal or a common signal in accordance with the control signal of the controller 57. The integrated driver 58 is connected to the controller 57 and provide at one side of the rear substrate 56. To describe more specifically, the integrated driver 58 is desirable to be provided in the rear substrate of the same side as the electrode terminal part 66 provide at one side of the front substrate 51 if possible. In the prior art, as shown in FIG. 2, the driver is divided into the scan driver 9 and the common driver 10, but in the present invention, the driver is an integrated driver 58 of the prior art scan driver and common driver.

Also, though it is not shown in FIG. 4, the rear substrate 56 includes an address driver to generate a driving signal for driving an address electrode 52 of FIG. 3.

Further, a connection member 55 is connected between the electrode terminal part 66 and the integrated driver 58 in order to apply a signal generated at the integrated driver 58 to the scan electrode 53 and the common electrode 54 of FIG. 3.

At this moment, the rear substrate 56 further includes a buffer 59 for applying the scan signal generated from the integrated driver 58 to a corresponding scan electrode. In this case, the connection member 55 is connected between the buffer 59 of the rear substrate 56 and the electrode terminal part 66 of the front substrate 51. The buffer 59 might include a connector (not shown) to connect the connection member 55 thereto.

The present invention has the most principal characteristic in how the connection member is composed in case that the driver is integrated, so the connection member 55 is to be described below in more detail according to the present invention.

FIG. 5 is a diagram representing a connection member according to a desirable embodiment according to the present invention.

As shown in FIG. 5, designated connection pads are arranged in the connection member 55. At this moment, the connection member 55 is desirable to be a flexible printed circuit FPC. Scan electrode pads Y 61, 71 and common electrode pads Z 62, 72 are arranged in parallel. If the electrodes arranged in the front substrate 51, as shown in FIG. 3, are arranged in order of the scan electrode 53, the common electrode 54, the common electrode 54 and the scan electrode 53, the electrode pads arranged in the connection member 55 of the rear substrate 56 are desirable to be arranged in order of the scan electrode pads Y 61, 71, the common electrode pads Z 62, 72, the common electrode pads Z 62, 72, and the scan electrode pads Y 61, 71. Accordingly, the electrodes 53, 54 arranged on the front substrate 51 are correspondingly connected to the electrode pads 61, 62, 71, 72 arranged on the rear substrate.

In the connection member 55, each of both bonding parts 60, 70 has two tier connection structure of the scan electrode pads 61, 71 and the common electrode pads 62 and 72. Herein, the two tier connection structure means that the positions of the ends 67, 68, 75, 76 of the scan electrode pads 61, 71 and the common electrode pads 62, 72 are arranged differently. That is, the ends 68, 76 of the scan electrode pads 61, 71 can be arranged to be drawn out longer than the ends 67, 75 of the common electrode pads 62, 72. Or, on the contrary to this, the ends 67, 75 of the common electrode pads 62, 72 can be arranged to be drawn out longer than the ends 68, 76 of the common electrode pads 61, 71. At any rate, the ends of any one of the scan electrode pads 61, 71 or the common electrode pads 62, 72 is drawn out longer than the ends of the other. Herein, the distance between the ends of the scan electrode pads 61, 71 and common electrode pads 62, 72 become different in accordance with the distance or width between the electrode pads 61, 62, 71, 72, thus it might be set to be optimized upon designing.

At this moment, each of the scan electrode pads 61 71 and the common electrode pads 62, 72 are all coated with an insulating material except for designated parts 63, 64, 73, 74 of the ends 67, 68, 75, 76. In this case, the electrode pads 61, 62, 71, 72 corresponding to the designated parts 63, 64, 73, 74 are used when bonding the electrode terminal part 66 with the buffer 59.

The position of the end of each electrode pad is made different in this way and the designated part except for the end of each electrode pad is coated with the insulating material, so that a short circuit, which might be generated between electrodes arranged with minute distance, can be prevented in advance, thereby preventing mis-operation from occurring upon driving.

As described above, the connection member and a driving device of a plasma display panel according to the present invention integrates the scan driver and the common driver, which were previously separated from each other, into one. And, on the other hand, it includes one single connection member that can connect the integrated driver with the electrode terminal part in order to apply the scan signal or the common signal generated from the integrated driver to the scan electrode and the common electrode arranged on the front substrate, thus it can reduce the number of the connection member and the driver as well as realizing a thinner type of the plasma display panel because more space can be secured on the rear substrate, thereby saving more cost.

Further, the driver and connection member, which were separated in the prior art, are integrated, thus having an effect of improving its drive characteristic when being controlled by the controller.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A plasma display apparatus, comprising:
   a connection member coupled to an electrode terminal part on a front substrate of a display panel; and
   an integrated driving circuit on a rear substrate of the display panel,
   wherein the connection member provides driving signals to at least one scan electrode and at least one common electrode coupled to the electrode terminal part, and
   wherein the connection member has a first joining part coupled to the electrode terminal part and a second joining part coupled to the integrated driving circuit, each of the first and second joining parts having a two-tier connection structure of a pad of said at least one scan electrode and a pad of said at least one common electrode.

2. The plasma display apparatus according to claim 1, wherein any one of the scan electrode pad or the common electrode pad is drawn out longer than the other.

3. The plasma display apparatus according to claim 1, all but ends of the scan electrode pad and the common electrode pad are coated with an insulating material.

4. The plasma display apparatus according to claim 1, wherein a width of the first joining part connected to the electrode terminal part is wider than that of the second joining part connected to the integrated driving circuit.

5. The plasma display apparatus according to claim 1, wherein the connection member is provided on one side of a display panel.

6. The plasma display apparatus according to claim 1, wherein the connection member is only provided on said one side of the display panel.

7. The plasma display apparatus according to claim 1, wherein the connection member receives the driving signals for the at least one scan electrode and the at least one common electrode from the integrated driving circuit.

8. A plasma display apparatus, comprising:
   a driving circuit on a rear substrate;
   a plurality of scan and common electrodes on a front substrate; and
   a connection member configured to carry a driving signal for at least one of the scan electrodes and at least one of the common electrodes, the connection member having a first joining part coupled to the driving circuit and a second joining part coupled to the scan and common electrodes, each of the first and second joining parts having a two-tier connection structure of a pad of said at least one scan electrode and a pad of said at least one common electrode.

9. The plasma display apparatus according to claim 8, wherein one of the scan electrode pad or the common electrode pad is drawn out longer than the other.

10. The plasma display apparatus according to claim 8, all but ends of the scan electrode pad and the common electrode pad are coated with an insulating material.

11. The plasma display apparatus according to claim 8, wherein a width of the first joining part is wider than that of the second joining part.

12. The plasma display apparatus according to claim 8, wherein the front substrate and the rear substrate correspond to different surfaces of a same substrate.

13. The plasma display apparatus according to claim 8, wherein the first joining part and the second joining part have different widths.

14. The plasma display apparatus according to claim 13, wherein the width of the first joining part is greater than the width of the second joining part.

15. The plasma display apparatus according to claim 13, wherein ends of the first and second joining parts are tapered.

16. A plasma display apparatus, comprising:
- a driving circuit on a rear substrate to drive a scan electrode and a common electrode on a front substrate; and
- a connection member having at least two joining parts, each of the joining parts having a two-tier connection structure of a scan electrode pad and a common electrode pad, wherein one joining part is coupled to the driving circuit and the other joining part is coupled to the scan electrode and common electrode.

17. The plasma display apparatus according to claim 16, wherein one of the scan electrode pad or the common electrode pad is drawn out longer than the other.

18. The plasma display apparatus according to claim 16, wherein all but ends of the scan electrode pad and the common electrode pad are coated with an insulating material.

19. The plasma display apparatus according to claim 16, wherein a width of said one joining part is wider than that of the other joining part.

20. The plasma display apparatus according to claim 16, wherein said one joining part is formed to correspond to a connection structure of the connection member.

21. The plasma display apparatus according to claim 16, wherein the connection member has a first layer where scan electrode pads are arranged and a second layer where common electrode pads are arranged.

22. The plasma display apparatus according to claim 16, wherein the scan electrode pad and the common electrode pad are arranged on a same surface in both of the joining parts of the connection member.

* * * * *